(12) United States Patent
Howland, Jr. et al.

(10) Patent No.: US 7,023,231 B2
(45) Date of Patent: Apr. 4, 2006

(54) WORK FUNCTION CONTROLLED PROBE FOR MEASURING PROPERTIES OF A SEMICONDUCTOR WAFER AND METHOD OF USE THEREOF

(75) Inventors: William H. Howland, Jr., Wexford, PA (US); Robert J. Hillard, Avalon, PA (US); Steven Chi-Shin Hung, Palo Alto, CA (US)

(73) Assignee: Solid State Measurements, Inc., Pittsburgh, PA (US)

( * ) Notice: Subject to any disclaimer, the term of this patent is extended or adjusted under 35 U.S.C. 154(b) by 13 days.

(21) Appl. No.: 10/845,815

(22) Filed: May 14, 2004

(65) Prior Publication Data
US 2005/0253618 A1    Nov. 17, 2005

(51) Int. Cl.
*G01R 31/26* (2006.01)

(52) U.S. Cl. ...................................... 324/765; 324/761
(58) Field of Classification Search ........ 324/754–765, 324/537, 717, 658; 438/14–17
See application file for complete search history.

(56) References Cited

U.S. PATENT DOCUMENTS

| | | | | |
|---|---|---|---|---|
| 5,378,971 A * | 1/1995 | Yamashita | .................. | 324/760 |
| 6,181,144 B1 * | 1/2001 | Hembree et al. | ............ | 324/754 |
| 6,492,827 B1 * | 12/2002 | Mazur et al. | ................ | 324/761 |
| 6,632,691 B1 * | 10/2003 | Howland | ..................... | 438/17 |
| 6,741,093 B1 * | 5/2004 | Howland et al. | ............ | 324/765 |
| 6,788,076 B1 * | 9/2004 | Howland | ..................... | 324/717 |
| 6,879,176 B1 * | 4/2005 | Hillard | ....................... | 324/765 |
| 6,894,519 B1 * | 5/2005 | Howland | ..................... | 324/765 |

* cited by examiner

*Primary Examiner*—Vinh P. Nguyen
(74) *Attorney, Agent, or Firm*—The Webb Law Firm

(57) ABSTRACT

In a method of measuring at least one electrical property of a semiconductor wafer, an elastically deformable conductive contact formed from an electrically conductive coating overlaying an electrically conductive base material is provided. The base material has a first work function and the coating has a second work function. A first electrical contact is formed between the conductive contact and a top surface of a semiconductor wafer. A second electrical contact is formed with the semiconductor wafer. An electrical stimulus is applied between the first and second electrical contacts and a response of the semiconductor wafer to the electrical stimulus is measured. At least one electrical property of the semiconductor wafer is determined from the response.

20 Claims, 2 Drawing Sheets

WORK FUNCTION CONTROLLED PROBE FOR MEASURING PROPERTIES OF A SEMICONDUCTOR WAFER AND METHOD OF USE THEREOF

BACKGROUND OF THE INVENTION

1. Field of the Invention

The present invention relates to testing of semiconductor wafers.

2. Description of Related Art

The use of conductive elastic probes for measuring one or more electrical properties of a semiconductor wafer is disclosed in U.S. Pat. No. 6,492,827 to Mazur et al. It has been observed that conductive elastic probes formed from certain materials, such as platinum, iridium or tantalum, or probes having platinum, iridium or tantalum-coated tips work best for testing semiconductor wafers. Heretofore, it was believed that the inability to grow oxides and/or the ability to grow conductive oxides on one or more of these materials rendered them more useful for such testing. However, in accordance with the present invention, it is believed that the work function of the probe surface that presses into contact with a semiconductor wafer during the testing can affect the measurement thereof.

What is, therefore, needed and which is not disclosed in the prior art is a method of measuring at least one electrical property of a semiconductor wafer with a contact or probe wherein at least the contact portion thereof has a controlled work function.

SUMMARY OF THE INVENTION

The invention is a method of measuring at least one electrical property of a semiconductor wafer that includes the steps of (a) providing an elastically deformable conductive contact formed from an electrically conductive coating overlaying an electrically conductive base material, wherein the base material has a first work function and the coating has a second work function; (b) forming a first electrical contact between the conductive contact and a top surface of a semiconductor wafer; (c) forming a second electrical contact with the semiconductor wafer; (d) applying an electrical stimulus between the first electrical contact and the second electrical contact; (e) measuring a response of the semiconductor wafer to the electrical stimulus; and (f) determining from the response at least one electrical property of the semiconductor wafer.

The conductive contact can be the tip of a probe. The coating can have a thickness of an extent whereupon the conductive contact has an overall work function that is either equal to the second work function or intermediate the first work function and the second work function. Desirably, the thickness of the coating is no more than five (5) Debye lengths.

The base material can be comprised of tantalum and the coating can be comprised of iridium.

Alternatively, the coating can include a layer of first material overlaying the base material and a layer of a second material overlaying the first material, wherein the second work function is related to, e.g., intermediate, the work functions of the first and second materials. Desirably, the base material, the first material and the second material are different metals. The base material can be comprised of tantalum, the first material can be comprised of iridium, and the second material can be comprised of at least one of a ruthenium and tantalum.

The invention is also a method of measuring at least one electrical property of a semiconductor wafer that includes the steps of (a) providing an elastically deformable conductive contact formed from an electrically conductive coating overlaying an electrically conductive base material, wherein the base material has a first work function and the coating has a second work function; (b) forming a first electrical contact between the conductive contact and a dielectric layer overlaying a top surface of the semiconductor wafer; (c) forming a second electrical contact with the semiconductor wafer; (d) applying an electrical stimulus between the first electrical contact and the second electrical contact; (e) measuring a response of the combination of the dielectric layer and the semiconductor wafer to the electrical stimulus; and (f) determining from the response at least one electrical property of the dielectric layer, the semiconductor wafer or both.

DETAILED DESCRIPTION OF THE INVENTION

The present invention will be described with reference to the accompanying figures, where like reference numbers correspond to like elements.

Figure 1:
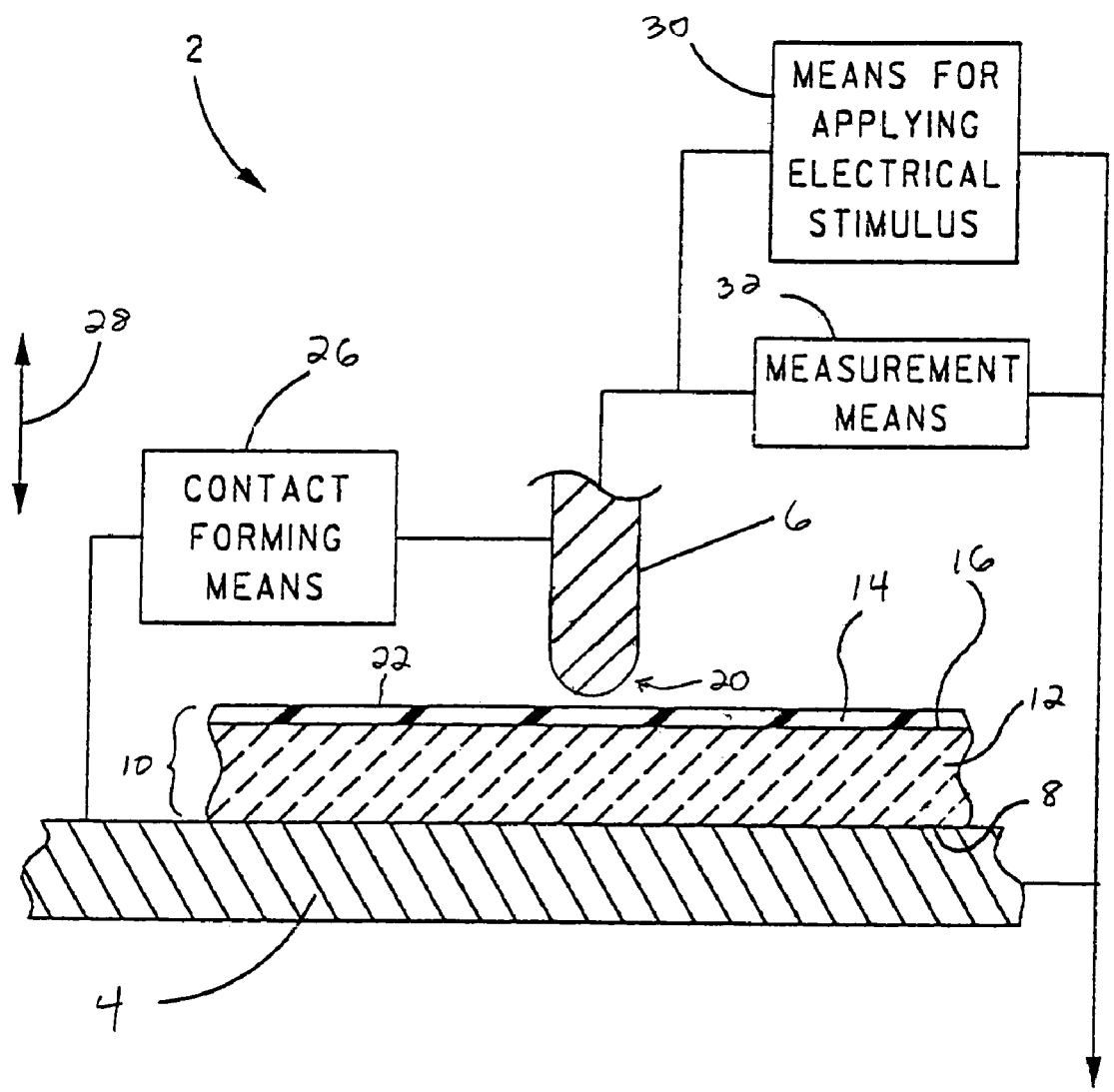
FIG. 1 is a cross-sectional view of a semiconductor wafer having a block diagram of a semiconductor wafer test system in operative relation thereto.

With reference to FIG. 1, a semiconductor wafer test system 2 includes an electrically conductive vacuum chuck 4 and a contact 6. The illustration of contact 6 in FIG. 1 in the form of an elongated probe is not to be construed as limiting the invention since it is envisioned that contact 6 can have any shape or form suitable for testing a semiconductor wafer 10. Chuck 4 is configured to support a backside 8 of a semiconductor wafer 10 which includes a substrate 12 formed of semiconducting material which is held in contact with chuck 4 by means of a vacuum (not shown). Semiconductor wafer 10 can, but does not necessarily, include a dielectric layer 14 overlaying a topside 16 of substrate 12.

Desirably, contact 6 includes at least a partially spherical and conductive surface 20 for contacting topside 16 of substrate 12 or a topside 22 of dielectric layer 14 when present. While a partially spherical conductive surface 20 is desired, it is envisioned that surfaces (not shown) having other shapes suitable for testing a semiconductor wafer 10 can be utilized. Accordingly, the illustration in FIG. 1 of conductive surface 20 being partially spherical is not to be construed as limiting the invention.

A contact forming means 26, of the type well known in the art, controls the vertical movement of chuck 4 and/or contact 6, in the directions shown by arrow 28, to move contact 6 and semiconductor wafer 10 toward each other whereupon contact 6 presses into contact with topside 16 of substrate 12 or topside 22 of dielectric layer 14 if present.

A means for applying electrical stimulus 30 can be electrically connected to apply a suitable electrical stimulus to contact 6 and semiconductor wafer 10 when it is received on chuck 4 and contact 6 is in contact with semiconductor wafer 10.

A measurement means 32 can be electrically connected for measuring the response of semiconductor wafer 10 to the test stimulus applied by the means for applying electrical stimulus 30. Desirably, chuck 4 is connected to a reference ground. However, this is not to be construed as limiting the invention since chuck 4 alternatively can be connected to an AC or DC reference bias.

Figure 2:
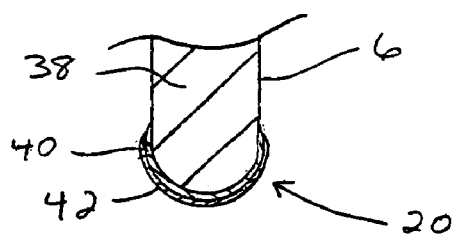
FIGS. 2–5 are different embodiments of a contact of the test system shown in FIG. 1.

With reference to FIG. 2, and with continuing reference to FIG. 1, a first embodiment of contact 6 includes a body 38 formed of a suitable electrically conductive material having an electrically conductive layer or coating 42, formed from iridium or an iridium alloy, overlaying an electrically conductive base material 40, such as tantalum or a tantalum alloy, in contact with body 38.

Figure 3:
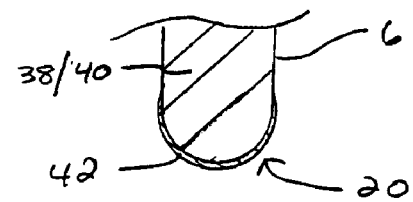

With reference to FIG. 3, and with continuing reference to FIGS. 1 and 2, a second embodiment of contact 6 includes electrically conductive coating 42 overlaying electrically conductive base material 40 which, in this embodiment, forms body 38 of contact 6.

Figure 4:
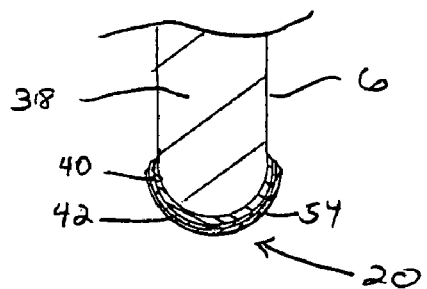

With reference to FIG. 4, and with continuing reference to FIGS. 1–3, another embodiment of contact 6 includes body 38 having coating 42 overlaying base material 40 in contact with body 38 in a manner similar to the embodiment of contact 6 shown in FIG. 2. However, in the embodiment of contact 6 shown in FIG. 4, a layer or coating 54, formed from ruthenium (Ru), tantalum (Ta) or a Ru—Ta alloy, overlays coating 42.

Figure 5:
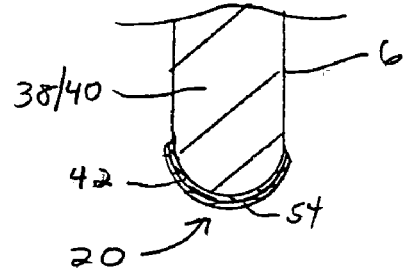

With reference to FIG. 5, and with continuing reference to FIGS. 1–4, another embodiment of contact 6 includes body 38 formed from a base material 40 like the embodiment of contact 6 shown in FIG. 3. In the embodiment of contact 6 shown in FIG. 5, however, coating 54 overlays coating 42.

As shown in FIGS. 2–5, it is only necessary that layers or coatings 42 and/or 54 define surface 20 of contact 6 which contact forming means 26 presses into contact with topside 16 of substrate 12 or topside 22 of dielectric layer 14 if provided. However, this is not to be construed as limiting the invention.

As shown in FIG. 2, coating 42 is desirably in electrical contact with body 38 only via base material 40. In other words, coating 42 is desirably not in direct electrical contact with body 38. In FIG. 3, coating 42 is directly in contact with body 38 formed from base material 40. In FIG. 4, coating 42 is desirably in contact with body 38 only via base material 40, and coating 54 is desirably in contact with body 38 only via coating 42 and base material 40. In other words, there is no direct electrical contact between coating 42 and body 38, or between coating 54 and base material 40 or body 38. In FIG. 5, coating 54 is desirably in contact with body 38 only via coating 42. In other words, coating 54 is not in direct electrical contact with body 38 formed from base material 40.

In the embodiments of contact 6 shown in FIGS. 2 and 3, coating 42 has a thickness whereupon surface 20 of each embodiment contact 6 has an overall work function equal to the work function of the material forming coating 42. Alternatively, in the embodiments of contact 6 shown in FIGS. 2 and 3, coating 42 can have a thickness whereupon surface 20 of each embodiment contact 6 has an overall work function that is intermediate the work functions of the materials forming coating 42 and base material 40. In order to achieve this intermediate work function, coating 42 must be thick enough to impart the work function of its material to the overall work function, but thin enough to avoid its work function from masking the work function of base material 40. In one non-limiting example, coating 42 has a thickness of no more than five (5) Debye lengths. However, this is not to be construed as limiting the invention.

In the embodiments of contact 6 shown in FIGS. 4 and 5, coating 54 desirably has a thickness whereupon surface 20 has an overall work function that is either equal to the work function of the material forming coating 54 or a work function intermediate the work functions of coatings 42 and 54. This intermediate work function can be achieved by controlling the thickness of coating 54 in the manner described above for coating 42 overlaying base material 40.

Desirably, the work function of surface 20 of each of the embodiments of contact 6 shown in FIGS. 2–5 is between 3.0 eV and 6.0 eV for testing semiconductor wafers. However, this is not to be construed as limiting the invention since the overall work function of surface 20 can be set as desired to optimize the testing of semiconductor wafers.

In the use of any of the embodiments of contact 6 shown in FIGS. 2–5, contact forming means 26 causes surface 20 of contact 6 to press into contact with either topside surface 16 of substrate 12 or topside 22 of dielectric layer 14 if provided, thereby forming a first electrical contact. The backside 8 of semiconductor wafer 10 in contact with chuck 4 defines a second electrical contact. Alternatively, the second electrical contact can be formed directly with substrate 12 or via another contact (not shown) in contact with topside surface 16 of substrate 12 or topside 22 of dielectric layer 14 if provided.

Once the first and second electrical contacts have been formed, the means for applying the electrical stimulus 30 applies a suitable electrical stimulus between the first electrical contact and the second electrical contact. During application of this electrical stimulus, measurement means 32 measures a response of the semiconductor wafer 10 to the electric stimulus. Based on this response, measurement means 32 can determine at least one electrical property of dielectric layer 14, substrate 12, an interface of dielectric layer 14 and substrate 12, or some combination thereof.

Non-limiting examples of suitable electrical stimuli that can be applied by the means for applying electrical stimulus 30 that measurement means 32 can measure include a capacitance-voltage type stimulus (CV), a conductance-voltage (GV) type stimulus, a charge-voltage (QV) type stimulus, and/or a current-voltage (IV) type stimulus. Non-limiting examples of electrical properties that can be determined from these stimuli include flat-band voltage ($V_{FB}$), threshold voltage ($V_T$) and leakage current ($I_{LEAK}$). Since details regarding the application of these electrical stimuli and the determination of at least one electrical property of dielectric layer 14, substrate 12, an interface of dielectric layer 14 and substrate 12, or some combination thereof, from these electrical stimuli are well known in the art, details regarding the application of these electrical stimuli and the determination of said at least one electrical property will not be described herein for purpose of simplicity.

The present invention has been described with reference to the preferred embodiments. Obvious modifications and alterations will occur to others upon reading and understanding the preceding detailed description. For example, each of the embodiments of contact 6 is illustrated as a probe having a tip defining surface 20. However, this is not to be construed as limiting the invention. Moreover, the illustration of the various layers 40, 42, 54 extending outside the radius of body 38 is shown for illustration purposes only. However, as would be appreciated by one skilled in the art, coatings 40, 42, and 54 are relatively thin whereupon these layers would not extend outside the radius of body 38 to the extent shown in FIGS. 2–5. It is intended that the invention be construed as including all such modifications and alterations insofar as they come within the scope of the appended claims or the equivalents thereof.

The invention claimed is:

1. A method of measuring at least one electrical property of a semiconductor wafer, the method comprising the steps of:
   (a) providing an elastically deformable conductive contact formed from an electrically conductive coating overlaying an electrically conductive base material, wherein:
   the base material has a first work function;
   the coating has a second work function; and
   the coating has a thickness of an extent such that the conductive contact has a work function that is intermediate the first work function and the second work function;
   (b) forming a first electrical contact between the conductive contact and a top surface of a semiconductor wafer;
   (c) forming a second electrical contact with the semiconductor wafer;
   (d) applying an electrical stimulus between the first electrical contact and the second electrical contact;
   (e) measuring a response of the semiconductor wafer to the electrical stimulus; and
   (f) determining from the response at least one electrical property of the semiconductor wafer.

2. The method of claim 1, wherein the conductive contact is a tip of a probe.

3. The method of claim 1, wherein the thickness of the coating is no more than five (5) Debye lengths.

4. The method of claim 1, wherein the base material is comprised of tantalum.

5. The method of claim 1, wherein the coating is comprised of iridium.

6. The method of claim 1, wherein:
   the coating includes a layer of first material overlaying the base material and a layer of a second material overlaying the first material; and
   the second work function is related to work functions of the first and second materials.

7. The method of claim 6, wherein the second work function is intermediate the work function of the first material and the work function of the second material.

8. The method of claim 6, wherein the base material, the first material and the second material are different metals.

9. The method of claim 6, wherein the base material is comprised of tantalum.

10. The method of claim 6, wherein:
    the first material is comprised of iridium; and
    the second material is comprised of at least one of ruthenium (Ru) and tantalum (Ta).

11. A method of measuring at least one electrical property of a semiconductor wafer, the method comprising the steps of:
    (a) providing an elastically deformable conductive contact formed from an electrically conductive coating overlaying an electrically conductive base material, wherein:
    the base material has a first work function;
    the coating has a second work function; and
    the coating has a thickness of an extent such that the conductive contact has a work function that is intermediate the first work function and the second work function;
    (b) forming a first electrical contact between the conductive contact and a dielectric layer overlaying a top surface of the semiconductor wafer;
    (c) forming a second electrical contact with the semiconductor wafer;
    (d) applying an electrical stimulus between the first electrical contact and the second electrical contact;
    (e) measuring a response of the combination of the dielectric layer and the semiconductor wafer to the electrical stimulus; and
    (f) determining from the response at least one electrical property of the dielectric layer, the semiconductor wafer or both.

12. The method of claim 11, wherein the conductive contact is a tip of a probe.

13. The method of claim 12, wherein the thickness of the coating is no more than five (5) Debye lengths.

14. The method of claim 11, wherein the base material is comprised of tantalum.

15. The method of claim 11, wherein the coating is comprised of iridium.

16. The method of claim 11, wherein:
    the coating includes a layer of first material overlaying the base material and a layer of a second material overlaying the first material; and
    the second work function is related to work functions of the first and second materials.

17. The method of claim 16, wherein the second work function is intermediate the work function of the first material and the work function of the second material.

18. The method of claim 16, wherein the base material, the first material and the second material are different metals.

19. The method of claim 16, wherein the base material is comprised of tantalum.

20. The method of claim 16, wherein:
    the first material is comprised of iridium; and
    the second material is comprised of at least one of ruthenium (Ru) and tantalum (Ta).

* * * * *